United States Patent [19]

Yamaha

[11] Patent Number: 5,786,625
[45] Date of Patent: Jul. 28, 1998

[54] MOISTURE RESISTANT SEMICONDUCTOR DEVICE

[75] Inventor: Takahisa Yamaha, Hamamatsu, Japan

[73] Assignee: Yamaha Corporation, Japan

[21] Appl. No.: 526,603

[22] Filed: Sep. 11, 1995

[30] Foreign Application Priority Data

Sep. 14, 1994 [JP] Japan .................................. 6-247154

[51] Int. Cl.$^6$ .............................. H01L 23/58; H01L 23/48
[52] U.S. Cl. ........................ 257/644; 257/634; 257/751; 257/767
[58] Field of Search ........................ 257/644, 647, 257/634, 636, 637, 751, 753, 767

[56] References Cited

U.S. PATENT DOCUMENTS

| | | | |
|---|---|---|---|
| 3,642,597 | 2/1972 | Sheldon | 257/171 |
| 4,017,340 | 4/1977 | Yerman | 257/790 |
| 4,040,874 | 8/1977 | Yerman | 257/792 |
| 4,161,743 | 7/1979 | Yonezawa et al. | 257/636 |
| 5,229,311 | 7/1993 | Lai et al. | 437/43 |
| 5,508,540 | 4/1996 | Ikeda et al. | 257/298 |
| 5,541,445 | 7/1996 | Quellet | 257/634 |

FOREIGN PATENT DOCUMENTS 5-335780  12/1993  Japan .

OTHER PUBLICATIONS

S. Wolf, Ph.D., "Silicon Processing for the VLSI Era, vol. 2: Process Integration", Lattice Press, Sunset Beach, California, pp. 602–605, 632–642.

Realize Inc., "Improvement on Hot Carrier Resistance by ECR Oxide Film With Good Quality", Breakthrough Seminar, Japan, Dec. 17, 1993.

Primary Examiner—David Ostrowski

[57] ABSTRACT

A MOS type transistor with a gate is formed on the surface of a semiconductor substrate, and thereafter an interlayer insulating film and a first level wiring layer on the insulating film are formed. The wiring layer is patterned to cover the gate electrode. A second level interlayer insulating film is formed covering the wiring layer 16, and a second level wiring layer is formed on the second level interlayer insulating film. The second level interlayer insulating film is a laminate of a silicon oxide film formed by plasma CVD using tetraethoxysilane, a spin-on-glass (SOG) film, and another similar silicon oxide film, sequentially formed in this order. An auxiliary electrode layer (blocking layer) of the first level wiring layer covering the gate electrode prevents moisture contents from being diffused from the second level interlayer insulating film toward the gate electrode. The water content diffusion preventing function of the auxiliary electrode layer may also be realized by forming the auxiliary electrode layer separately from the wiring layer.

18 Claims, 12 Drawing Sheets

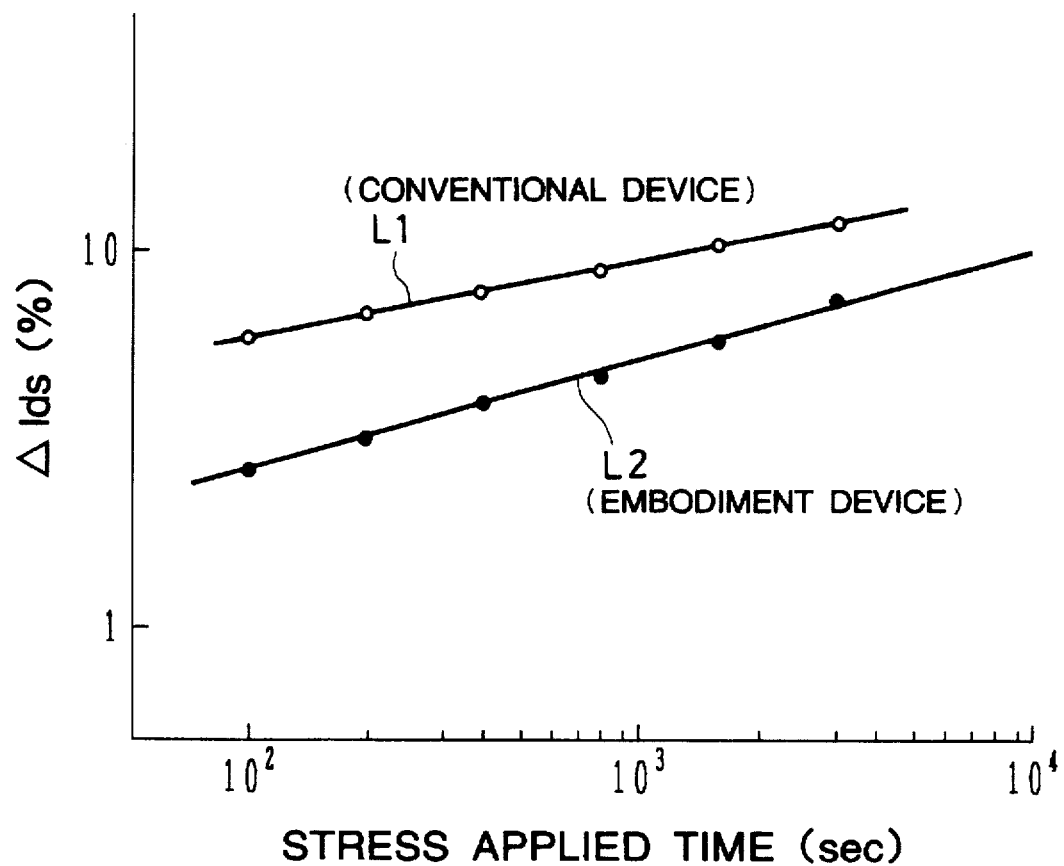

MOISTURE RESISTANT SEMICONDUCTOR DEVICE

BACKGROUND OF THE INVENTION a) Field of the Invention

The present invention relates to semiconductor devices such as LSIs having MOS transistors, and more particularly to semiconductor devices capable of preventing degradation of resistance to hot carriers.

b) Description of the Related Art

As a technique of planarizing an interlayer insulating film used for MOS type LSIs or the like, there is known a technique of forming an insulating film on an irregular surface by using material having a fluidity such as spin-on-glass (SOG). Although SOG has planarization ability, it contains moisture contents, and in addition, resistance to the moisture is not sufficient. For this reason, a structure has been used conventionally wherein an insulating film made of SOG is interposed between a pair of insulating films formed by chemical vapor deposition (CVD).

FIGS. 10 and 11 show part of a MOS type LSI using a planarization technique of this kind. FIG. 11 is a plan view showing a wiring configuration, and FIG. 10 is a cross sectional view taken along line B—B' of FIG. 11.

On the surface of a silicon semiconductor substrate 10, a field insulating film 12 of silicon oxide is formed by a known selective oxidation process. The insulating film 12 has an aperture or moat 12A in which an active region is defined. On the semiconductor surface exposed in the aperture 12A, a gate electrode G1, which may be composed of policide, is formed, with a gate insulating film OX being interposed between the semiconductor surface and gate electrode. Thereafter, n-type source and drain regions LS and LD of low impurity concentration are formed by ion implantation or other processes. After side spacers, which may be composed of silicon oxide, are formed on both sides of the gate electrode G1, n$^+$-type source and drain regions S1 and D1 of high impurity concentration are formed overlapping the regions LS and LD by ion implantation or other processes.

A gate electrode G2 is formed by the same process as the gate electrode G1. Associated parts of the gate electrode G2 including the source and drain regions of low impurity concentration, side spacers, and source and drain regions of high impurity concentration are formed in the same processes as those for the corresponding associated parts of the gate electrode G1. The drain region D1 functions as the drain of the transistor having the gate G1, and also as the source of the transistor having the gate G2.

Next, an insulating film 14, which may be composed of silicon oxyde, is formed over the substrate by CVD, covering the transistor structure formed on the substrate. After the contact holes for such as source contacts SC, drain contacts DC, and gate contacts GC$_1$ and GC$_2$ are formed through the insulating film 14, a wiring layer is deposited over the substrate. This wiring layer is patterned to form first level wiring layers including layers 16 and 17. The wiring layer 16 is a ground wiring layer connected to the source region 16 at the contact SC, and the wiring layer 17 is a drain wiring layer connected to the drain region D2 at the contact DC. The gate wiring layer is not shown in FIG. 10.

Next, a first level interlayer insulating film 18 is formed over the insulating film 14, covering the wiring layers including layers 16 and 17. The first level insulating film 18 is constituted by a silicon oxide film 20 formed by CVD, an SOG film 22 formed by spin coating on the silicon oxide film 20 and having a flat surface, and another silicon oxide film 24 formed by CVD on the SOG film.

Thereafter, a second level wiring layer 26 is formed on the first level insulating film 18, and a passivation film 28, which may be composed of silicon nitride, is formed on the second level wiring layer 26.

The first level interlayer insulating film 18 has the SOG film 22 which is hygroscopic and contains a large amount of moisture contents. Therefore, water contents diffuse from the interlayer insulating film 18 toward the gate electrodes G1 and G2, causing the problem of degradation of resistance to hot carriers of transistors.

In order to solve this problem, it has been proposed to use a silicon oxide film of good quality formed by electron cyclotron resonance (ECR) plasma CVD, as the insulating film under the SOG film. For example, refer to a report of "Improvement on Hot Carrier Resistance by ECR Oxide Film with Good Quality", at Breakthrough Seminar opened on Dec. 17, 1993 and promoted by Realize Inc., in Japan.

However, if a silicon oxide film formed by ECR plasma CVD has local defects or changes its film quality, the effects of preventing moisture content diffusion becomes insufficient so that the transistor characteristics may be changed by hot carriers.

SUMMARY OF THE INVENTION

It is an object of the present invention to provide a novel semiconductor device sufficiently ensuring the effects of preventing moisture content diffusion.

It is another object of the present invention to provide a simple method of manufacturing such a semiconductor device as described above.

According to one aspect of the present invention, there is provided a method of manufacturing a semiconductor device, comprising the steps of:

(a) forming an active element on a semiconductor substrate;

(b) forming a first interlayer insulating layer over the active element;

(c) forming a blocking region over the active element;

(d) forming a wiring layer contacting the active element; and (e) forming a second interlayer insulating layer over the wiring layer and the active element, wherein the second interlayer insulating layer includes moisture contents therein degrading performances of the active element, and wherein the blocking region blocks penetration of the moisture contents into the active element.

The wiring layer is generally made of metal, and the blocking region (auxiliary wiring layer) made of the same material as the wiring layer has an excellent moisture content preventing function as compared to an insulating film formed by CVD or the like.

The blocking region or auxiliary wiring layer can be formed readily by the same process as the wiring layer, without any additional process.

The blocking region or auxiliary wiring layer made of the same material as the wiring layer ensures a sufficient moisture content preventing performance. Accordingly, the transistor characteristics can be prevented from being changed by hot carriers, and a MOS type LSI of high reliability can be realized.

The blocking region or auxiliary wiring layer can be formed by using the wiring layer forming process so that the number of processes is not increased.

BRIEF DESCRIPTION OF THE DRAWINGS

FIG. 9 is a graph showing the comparison results of hot carrier resistance degradation tests between conventional and embodiment devices.

DETAILED DESCRIPTION OF THE PREFERRED EMBODIMENTS

Figure 1:
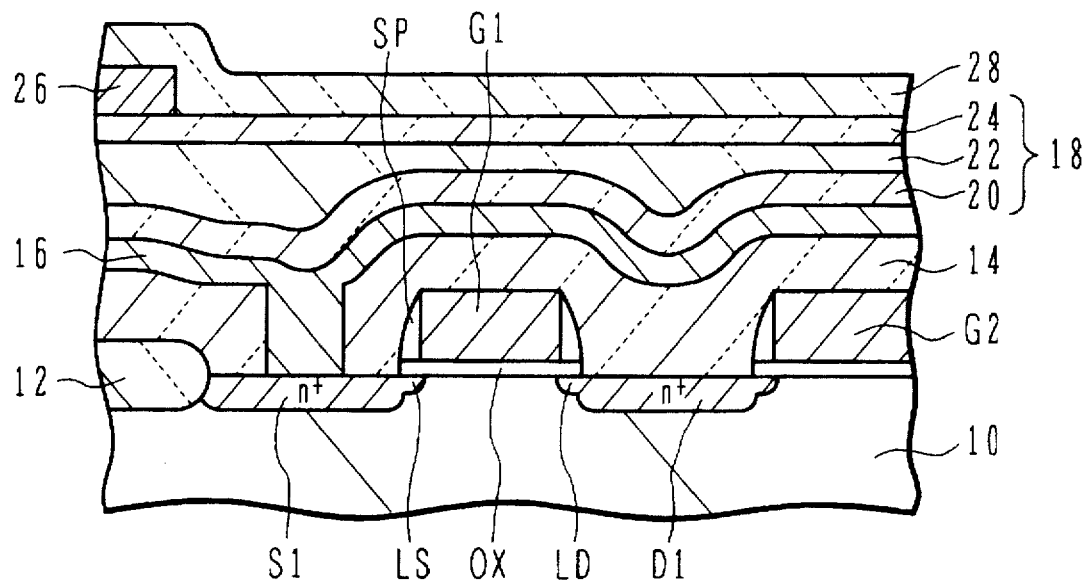
FIG. 1 is a cross sectional view of a semiconductor device according to an embodiment of the invention.
Figure 2:
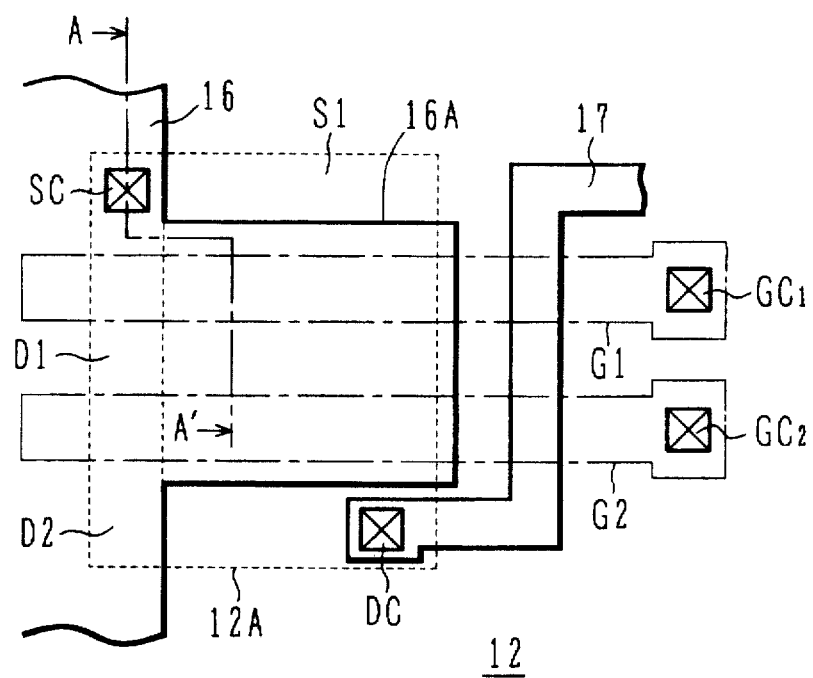
FIG. 2 is a plan view showing a first example of a wiring configuration of the device shown in FIG. 1.

FIGS. 1 and 2 show part of a MOS type LSI according to an embodiment of the invention. FIG. 1 is a cross sectional view of the device taken along line A–A' in FIG. 2.

Figure 10:
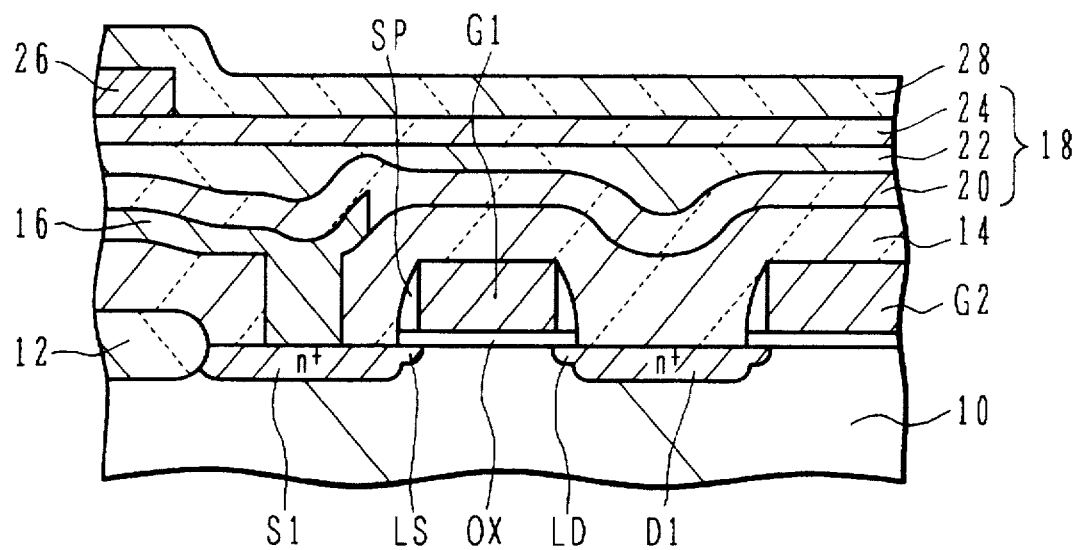
FIG. 10 is a cross sectional view of a substrate of a conventional semiconductor device.
Figure 11:
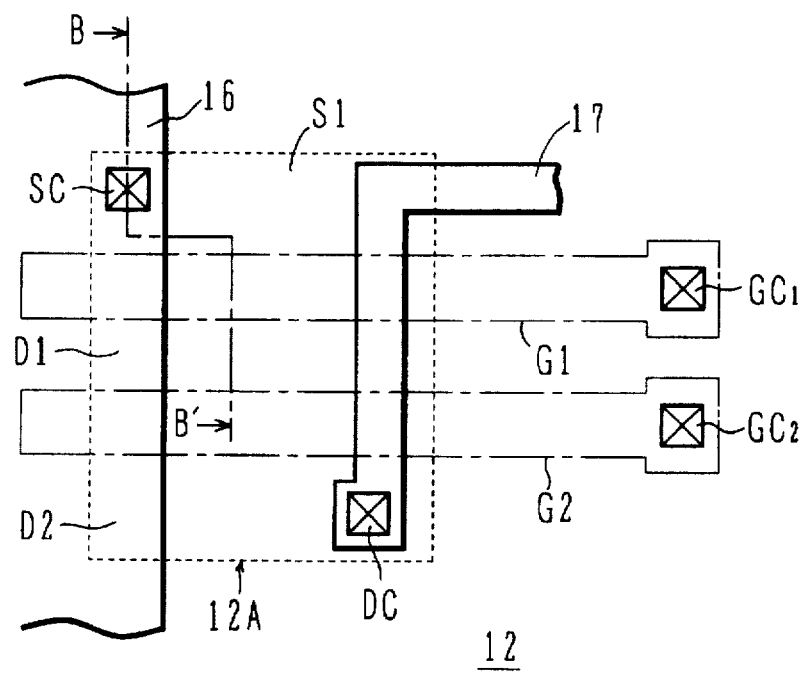
FIG. 11 is a plan view showing an example of a wiring configuration of the device shown in FIG. 10.

Similar to the processes described with reference to FIGS. 10 and 11, formed on the surface of a semiconductor substrate 10 made of, for example, silicon, are a field insulating film 12, a gate insulating film OX, n-type source and drain regions LS and LD of low impurity concentration, gate electrodes G1 and G2, side spacers SP, n$^+$-type source and drain regions S1 and D1 of high impurity concentration, and other necessary constituents.

The gate electrode G2 is formed at the same time when the gate electrode G1 is formed. Peripheral parts of the gate electrode G2 including the source and drain regions of low impurity concentration, side spacers, and source and drain regions of high concentration are formed by the same processes as those for the corresponding peripheral parts of the gate electrode G1. The drain region D1 functions as the drain of the transistor having the gate G1, and also as the source of the transistor having the gate G2. The drain region D2 functions as the drain of the transistor having the gate G2.

Next, an insulating film 14 is formed over the substrate by CVD, covering the transistor structure formed on the substrate. The insulating film 14 may be a boron phosphorous silicate glass (BPSG) film formed to a thickness of 750 nm by CVD.

Contact holes for such as source contacts SC, drain contacts DC, and gate contacts GC$_1$ and GC$_2$ are formed through the insulating film 14. Thereafter, a wiring layer, which may be composed of an Al alloy, is deposited over the substrate. This wiring layer is patterned to form first level wiring layers including layers 16 and 17. As apparent from the comparison between FIGS. 2 and 11, an auxiliary wiring layer (blocking region) 16A is formed continuously from the ground wiring layer 16 connected to the source S1, extending over the gate electrodes G1 and G2 near to the drain wiring layer 17. The auxiliary wiring layer 16A is used as a moisture content diffusion preventing film. The gate wiring layer is not shown in FIG. 1.

Next, an interlayer insulating film 18 is formed over the insulating film 14, covering the wiring layers including layers 16 and 17 and the auxiliary wiring layer 16A. The insulating film 18 is constituted, for example, by a silicon oxide film 20, an SOG film 22, and another silicon oxide film 24, respectively formed in this order from the bottom. The silicon oxide film 20 is formed to a thickness of 500 nm by plasma CVD using tetraethoxysilane (TEOS). The SOG film 22 is formed flat to a thickness of 500 nm by spin coating. The silicon oxide film 24 is formed to a thickness of 500 nm by plasma CVD using TEOS.

Thereafter, a wiring layer, which may be composed of an Al alloy, is deposited on the insulating film 18, and patterned to form a second level wiring layer 26. A passivation film 28 is formed covering the insulating film 18 and the second wiring layer 26. The passivation film 28 may be a silicon nitride film of 1000 nm thick formed by plasma CVD.

In the structure shown in FIGS. 1 and 2, water contents tend to diffuse toward the gate electrodes G1 and G2 from the interlayer insulating film 18 having the SOG film 22 which is hygroscopic and has a large amount of water contents. However, such diffusion of water contents is eliminated by the water content diffusion preventing function of the auxiliary wiring layer 16A. It is therefore possible to suppress a change in the transistor characteristics to be caused by hot carriers.

Figure 3:
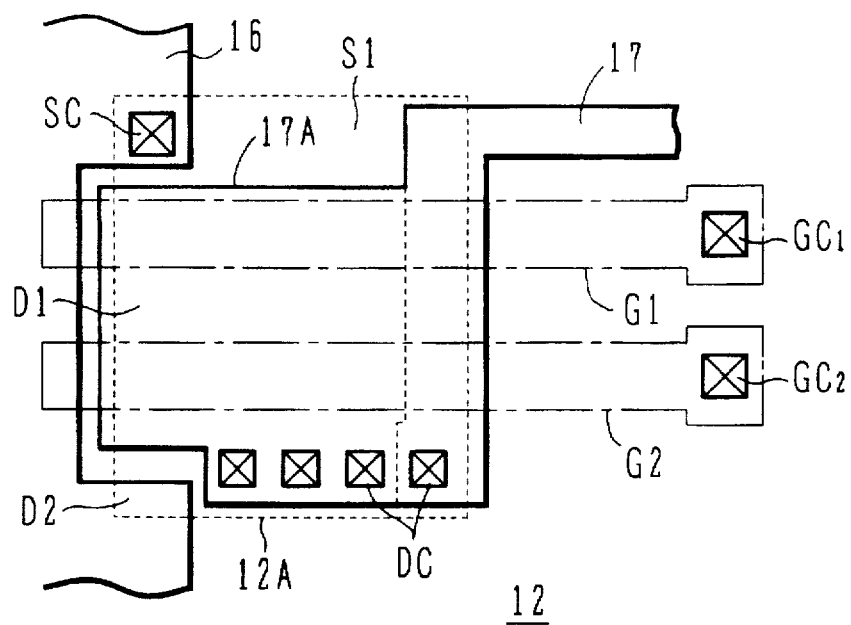
FIG. 3 is a plan view showing a second example of the wiring configuration.
Figure 4:
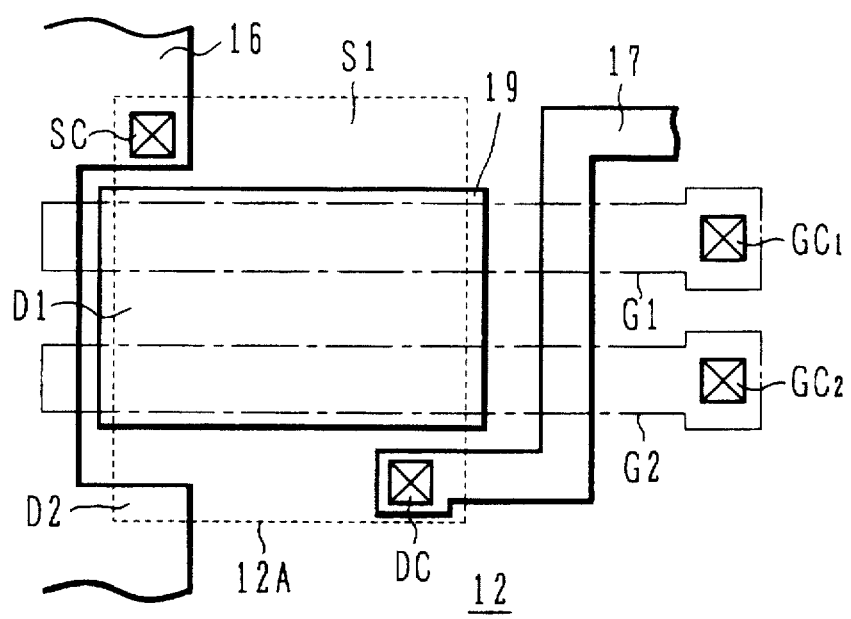
FIG. 4 is a plan view showing a third example of the wiring configuration.
Figure 5:
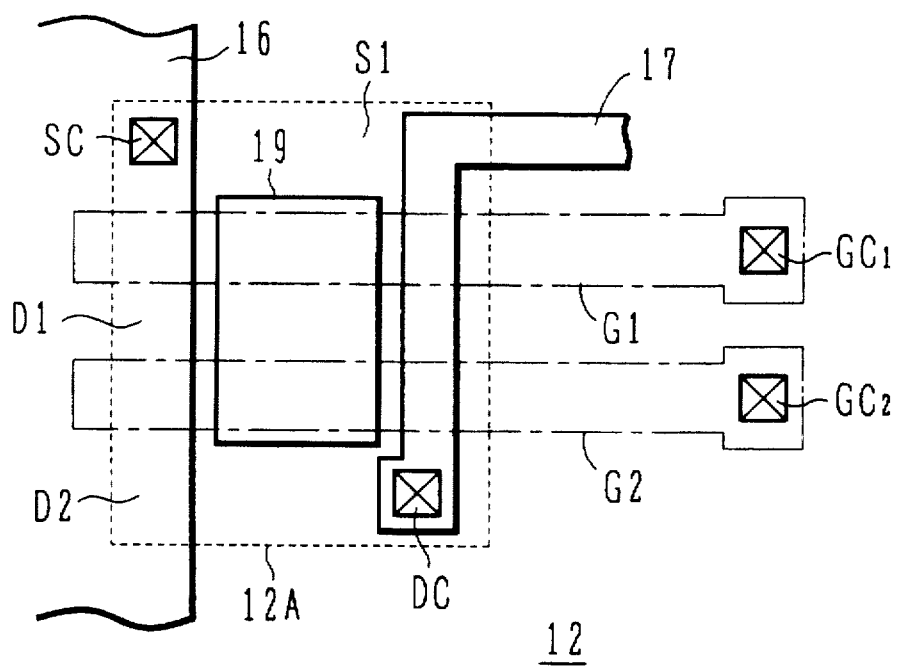
FIG. 5 is a plan view showing a fourth example of the wiring configuration.

FIGS. 3 to 5 show other examples of wiring configurations. In FIGS. 3 to 5, like elements to those shown in FIG. 2 are represented by identical reference numerals and characters, and the detailed description thereof is omitted.

In the example shown in FIG. 3, an auxiliary wiring layer 17A is formed continuously from a drain wiring layer 17, extending over the gate electrodes G1 and G2 near to the ground wiring layer 16. The auxiliary wiring layer 17A is used as a moisture content diffusion preventing film. The main wiring layer 17 and auxiliary wiring layer 17A are connected to the drain region D2 at four contacts DC.

In the example shown in FIG. 4, an auxiliary wiring layer (dummy layer) 19 is made of the same material as the wiring layers 16 and 17 and formed between the wiring layers 16 and 17, covering the gate electrodes G1 and G2. The auxiliary wiring layer 19 is used as the moisture content diffusion preventing film. In this case, in order for the auxiliary wiring layer 19 to effectively cover the electrodes G1 and G2, the wiring layers 16 and 17 are formed partially dislocating from the active region 12A (being formed on the field insulating film 12).

In the example shown in FIG. 5, an auxiliary wiring layer (dummy layer) 19 is formed between the wiring layers 16 and 17 similar to FIG. 4, and used as the moisture content diffusion preventing film. If the wiring layers 16 and 17 cannot be formed partially dislocating from the active region as shown in FIG. 4, they are not dislocated and the auxiliary wiring layer 19 is formed between the wiring layers 16 and 17. In this case, although an area covered with the auxiliary wiring layer 19 reduces, the moisture content diffusion preventing effects can be obtained more than the conventional technique.

The auxiliary wiring layers (dummy layers) shown in FIGS. 4 and 5 can be easily formed by using the same process as the process of forming the wiring layers 16 and 17. Namely, in patterning the wiring layer, the auxiliary wiring layer is left unetched between the wiring layers 16 and 17.

Forming an auxiliary wiring layer over gate electrodes by using the first level wiring layer has been described with reference to FIGS. 1 to 5. The method of manufacturing such a semiconductor device will be described in more detail with reference to FIGS. 6A to 6J, by taking as an example the semiconductor device shown in FIGS. 1 and 2. It is apparent for those skilled in the art that the same method can be used for realizing the wiring configurations shown in FIGS. 3 to 5.

Figure 6A:
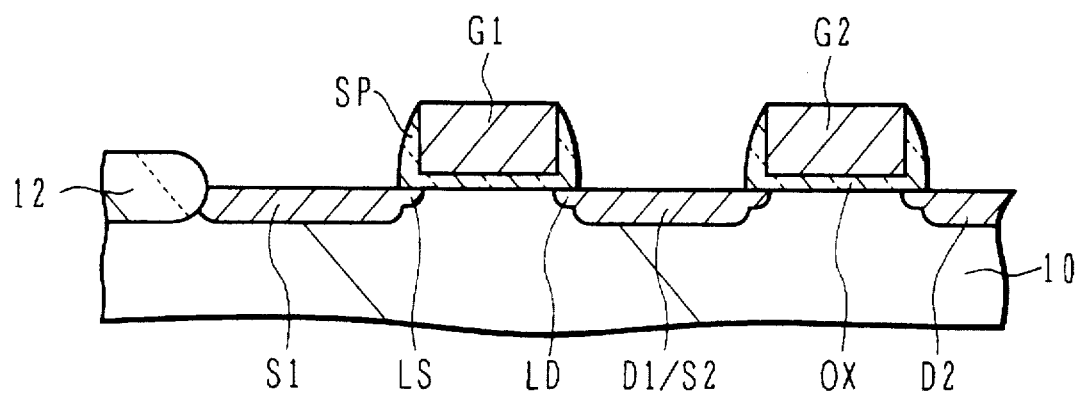
FIGS. 6A to 6J are cross sectional views of a substrate illustrating a method of manufacturing a semiconductor device such as shown in FIGS. 1 and 2.

As shown in FIG. 6A, on the surface of a p-type silicon substrate 10, a field oxide film 12 is formed by local oxidation of silicon (LOCOS). Covering the active region defined by the field oxide film 12, a gate insulating film OX os $Sio_2$ is formed and a polycide layer for gate electrodes G1 and G2 are formed thereon. After the gate electrodes G1 and G2 and gate insulating film OX are patterned, n-type impurity ions are lightly doped to form n-type regions LS and LD of a lightly doped drain (LDD) structure. Next, a silicon oxide film is formed over the whole surface of the substrate by CVD to leave side spacers SP only on the side walls of the gate electrodes Ga and G1 by anisotropic etching.

By using the gate electrodes G1 and G2, side spacers SP, and field oxide films as etching masks, n-type impurity ions are implanted into the substrate to form an $n^+$-type source region, an $n^+$-type source/drain region D1/S2, and an $n^+$-type drain region D2, respectively of high impurity concentration.

In the this description, although the structure of two transistors connected in series is used, the circuit structure of a single transistor or two transistor connected in parallel may also be applied.

Figure 6B:
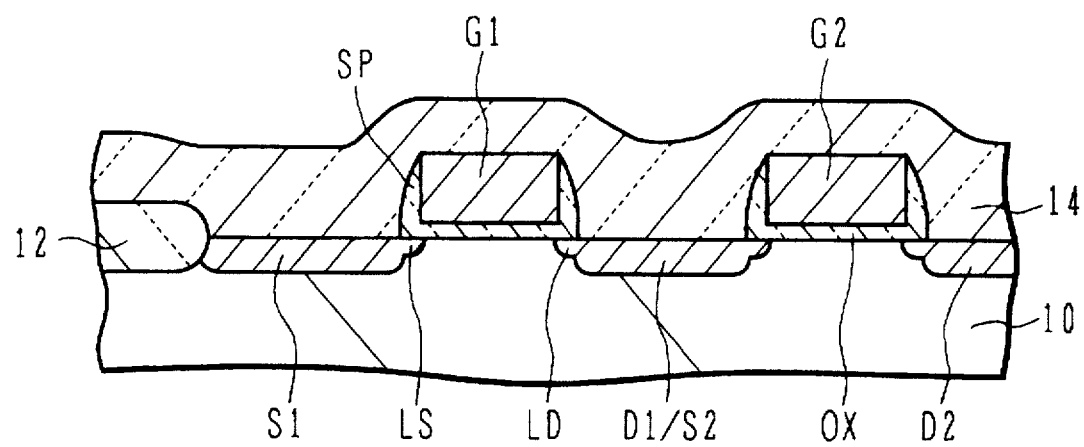

As shown in FIG. 6B, an interlayer insulating film 14 is formed over the substrate, covering the gate electrodes. The interlayer insulating film 14 may be a silicon oxide film of phosphorous silicate glass (PSG), BPSG, or TEOS-ozone formed by CVD.

Figure 6C:
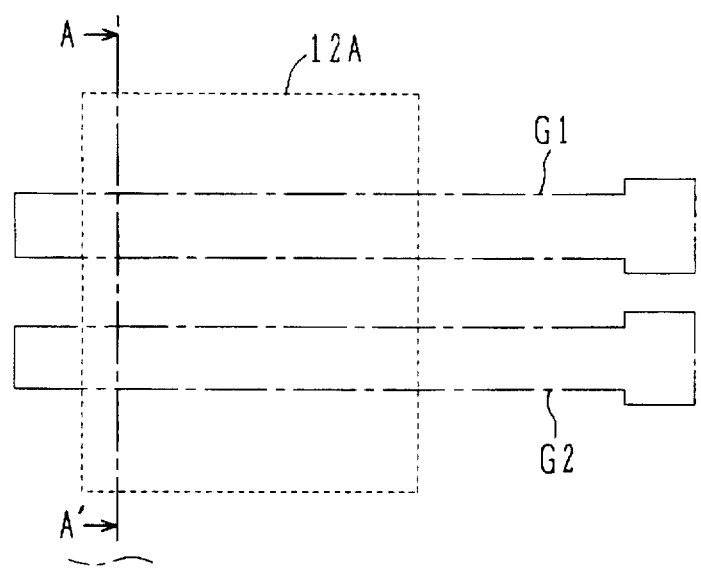

FIG. 6C is a schematic plan view showing the layout of the active region and the gate electrodes. The active region 12A defined by the field oxide film is surrounded by broken lines. The outside area of these broken lines is the field oxide film and the inside area thereof is the active region. The gate electrode G1 and G2 are formed extending in the lateral direction. The cross sectional views of FIGS. 6A and 6B, and other views to follow are taken along line A—A' in FIG. 6C.

Figure 6D:
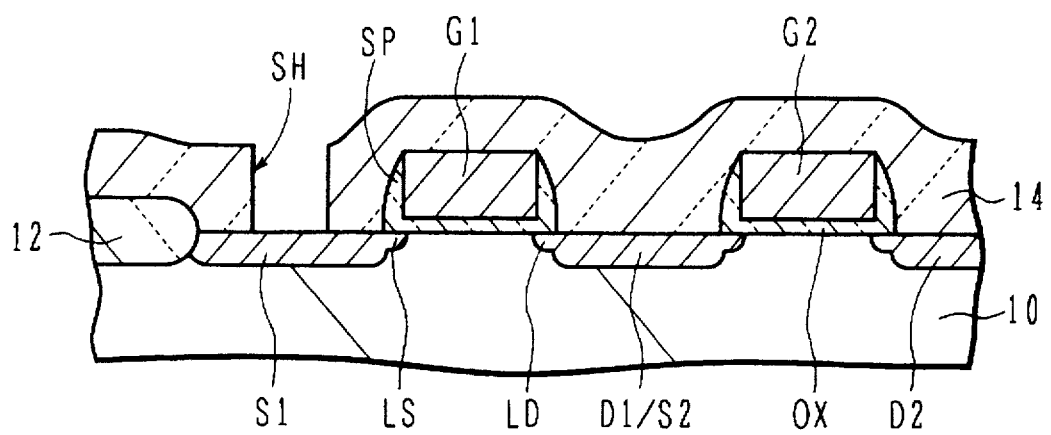

FIG. 6D is a cross sectional view showing an opened contact hole SH for the connection of a wiring layer to the source region S1. The contact hole SH is formed in the following manner. For example, a photoresist layer is spin-coated on the interlayer insulating film 14, exposed and developed to form a window region corresponding to the contact hole SH, and the interlayer insulating film 14 exposed in the window region is anisotropically etched.

Figure 6E:
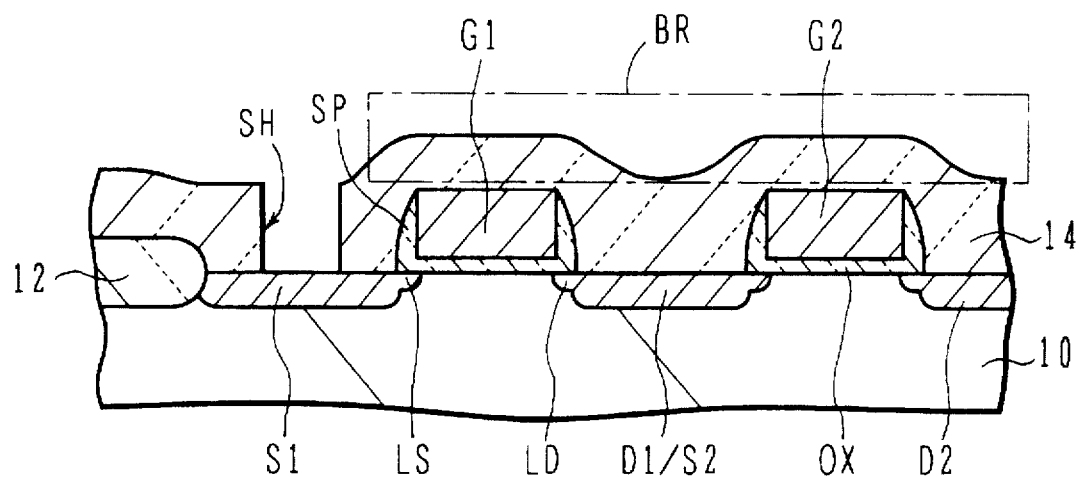
Figure 6F:
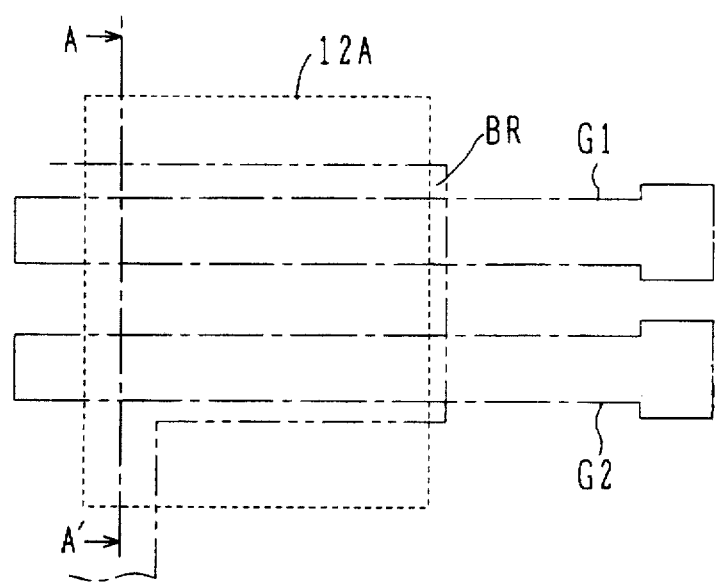

FIGS. 6E and 6F show the location of a blocking region to which the water content diffusion blocking function is imparted. The blocking region BR is defined over the active region so as to cover the gate electrodes not covered by a main wiring layer connected to the active region.

Figure 6G:
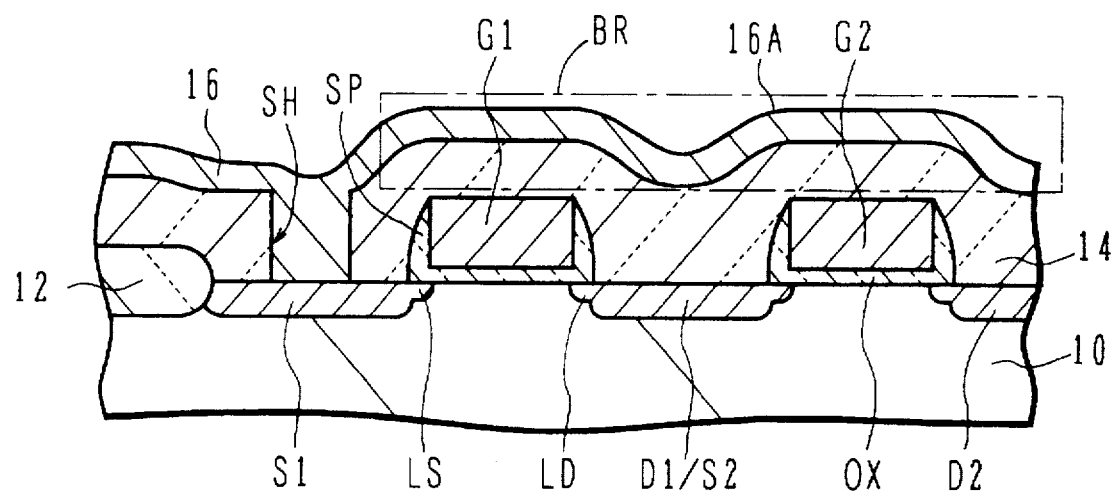

As shown in FIG. 6G, a source wiring layer 16 is formed covering the interlayer insulating film 14 and filling the inside of the contact hole SH.

Figure 6H:
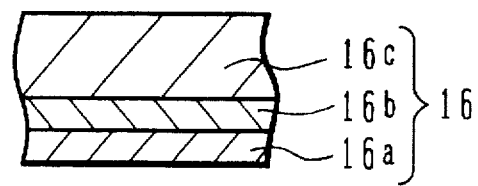

As shown in FIG. 6H, the wiring layer 16 is made of a laminate of a contact layer 16a, a barrier layer 16b, and a main wiring layer 16c. The contact layer 16a is formed by sputtering Ti. The barrier layer 16b is formed of TiN or TiON manufactured through reactive ion sputtering. Instead of a laminate of the contact layer and barrier layer, a single barrier layer of TiW may be used. The main wiring layer 16c is made of aluminum alloy such as Al—Si—Cu and Al—Si, or aluminum metal.

Thereafter, a photoresist layer is spin-coated on the wiring layer 16, exposed and developed to form a resist mask. Then, by using the resist mask as an etching mask, the wiring layer 16 is patterned to form a desired wiring layer pattern.

Figure 6I:
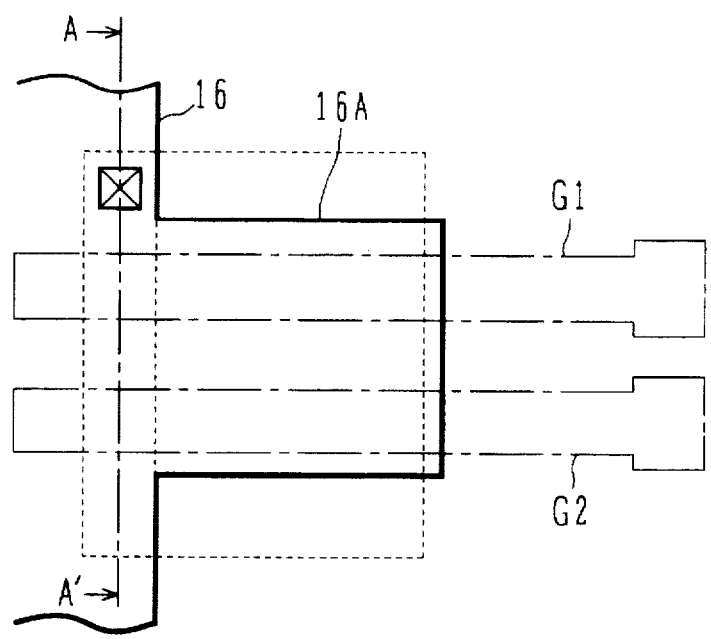

FIG. 6I is a plan view of a main wiring layer 16 and an auxiliary wiring layer 16A. The auxiliary wiring layer (blocking layer) 16A is formed over the gate electrodes and channel regions, and is resistant to moisture penetration. Although the auxiliary wiring layer 16A is not necessary for providing the essential function of electrodes and wiring, it is connected to the source wiring layer 16 connected to the source region S1. The auxiliary wiring layer 16A functions as a layer for blocking water contents. The auxiliary wiring layer 16A is patterned so as to occupy the blocking region BR shown in FIGS. 6E and 6F. Namely, it is formed over the gate electrodes G1 and G2 so as to cover the area as broad as possible in the vertical and horizontal directions as viewed in FIG. 6I.

Figure 6J:
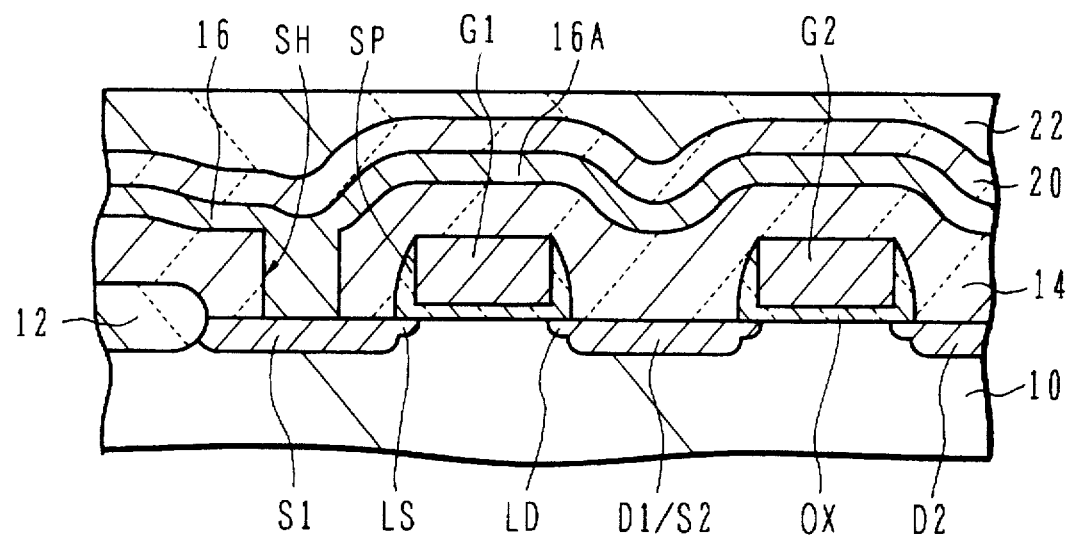

As shown in FIG. 6J, an interlayer insulating film 20 is formed covering the layers 16 and 16A conformal thereto. Next, an interlayer insulating film 22 having a planarization function is formed. The interlayer insulating film 20 is formed by the same method and material as the interlayer insulating film 14. The interlayer insulating film 22 with the planarization function is an SOG film. The SOG film may be made of organic or inorganic SOG. SOG contains moisture contents ($H_2O$, OH, $H^+$) which deteriorate hot carrier resistance of FETs when they reach the active region. However, because the auxiliary electrode layer 16A (blocking layer) overlaps the gate electrodes and forms an overhang, moisture contents tending to diffuse from SOG into the substrate are blocked.

By forming the interlayer insulating film 24, second level wiring layer, and passivation layer over the substrate shown in FIG. 6J, the structure shown in FIG. 1 is completed.

The structures shown in FIGS. 3 to 5 can be realized by the same process as above, by changing the pattern of the auxiliary electrode layer when the wiring layer 16 is patterned. In any of the wiring configurations, the auxiliary electrode layer (blocking layer) overlaps the gate electrodes of FETs so that moisture contents tending to diffuse from SOG toward the gate electrode can be blocked.

The auxiliary electrode layer over the gate electrodes is not necessary for providing the essential function of electrodes. However, it is not preferable for the auxiliary electrode layer to have a capacitance relative to the gate electrode or a fluctuating potential. Therefore, if the source region is fixed to the ground potential, the auxiliary electrode layer 17A may be connected to the source electrode as shown in FIG. 2. If the drain electrode is supplied with a source voltage $V_{DD}$, the auxiliary electrode layer 17A may be connected to the drain electrode 17 as shown in FIG. 3. In both the cases, there occurs another effect that the gate electrode is shielded by a constant potential at the auxiliary electrode layer.

If the potentials of both the source and drain electrodes fluctuate, it is preferable to make the auxiliary electrode layer electrically isolated as shown in FIGS. 4 and 5. Also in this case, the auxiliary electrode layer has a function of electrically shielding external noises. If the potentials of both the source and drain electrodes fluctuate and a power source wiring line having a constant potential such as ground level and voltage source potentials is formed near the transistor structure, the auxiliary electrode layer may be connected to such a constant potential wiring line.

Figure 7:
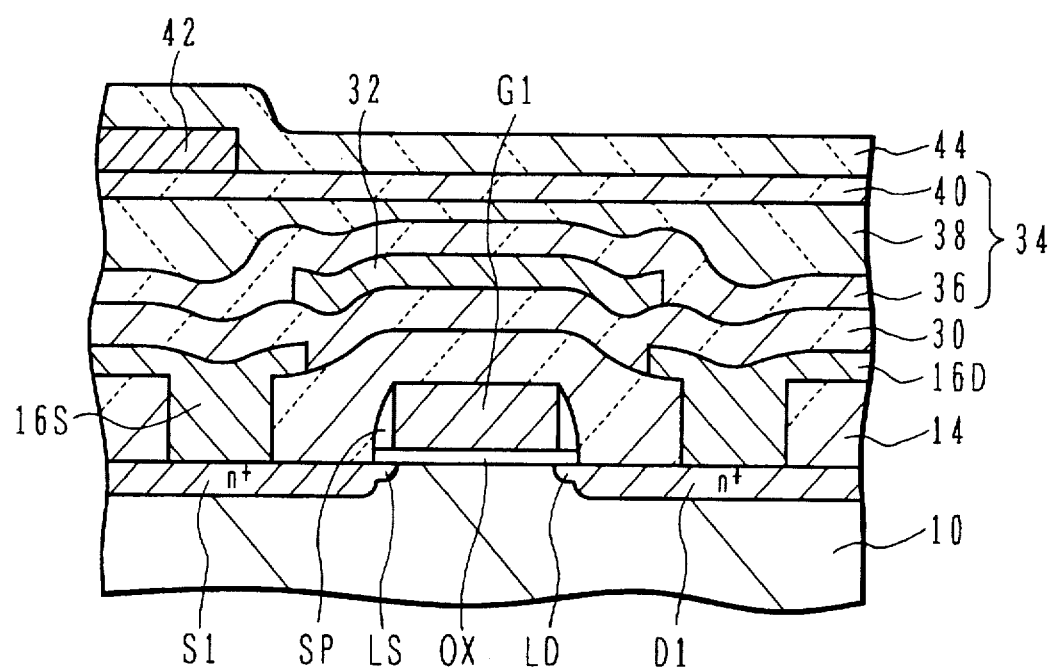
FIG. 7 is a cross sectional view of a substrate of a semiconductor device according to another embodiment of the invention.

FIG. 7 shows part of a MOS type LSI according to another embodiment of the invention. In this embodiment, the auxiliary wiring layer is formed by using a second level wiring layer among three wiring layers. In FIG. 7, like elements to those shown in FIG. 1 are represented by identical reference numerals and characters, and the detailed description thereof is omitted.

In the structure shown in FIG. 7, the processes up to forming the insulating film 14 are similar to those described with reference to FIG. 1. After contact holes for the source and drain regions are formed through the insulating film 14, a wiring layer is deposited over the substrate surface, and patterned to form wiring layers 16S and 16D. The wiring layers 16S and 16D constitute the electrode/wiring connected to the source and drain regions S1 and D1.

Next, an interlayer insulating film 30 is formed over the insulating film 14, covering the wiring layers 16S and 16D. An auxiliary wiring layer 32 having the water content diffusion preventing function is formed on the insulating film, covering the wiring layers 16S and 16D. The auxiliary wiring layer 32 may be electrically connected the source/drain electrode layer or isolated therefrom, and can be readily formed by the process of forming a second level wiring layer.

Next, an interlayer insulating film 34 is formed on the insulating film 30, covering the auxiliary wiring layer 32. The insulating film 34 is a laminate of an silicon oxide film 36, an SOG film 38, and a silicon oxide film 40 sequentially stacked one upon another, which corresponds to the silicon oxide film 20, SOG film 22, and silicon oxide film 24 respectively shown in FIG. 1.

Thereafter, a third level wiring layer 42 is formed on the insulating film 34. A passivation film 44 is formed on the insulating film 34, covering the wiring layer 42.

Figure 8A:
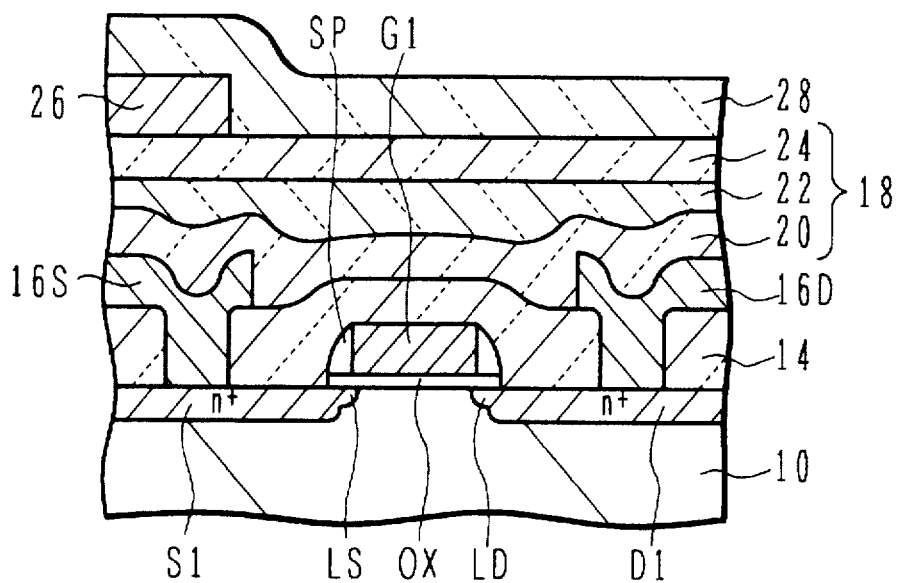
FIGS. 8A and 8B are cross sectional views of substrates showing the structures of samples used for the comparison of hot carrier resistance degradation tests between conventional devices and embodiment devices.
Figure 8B:
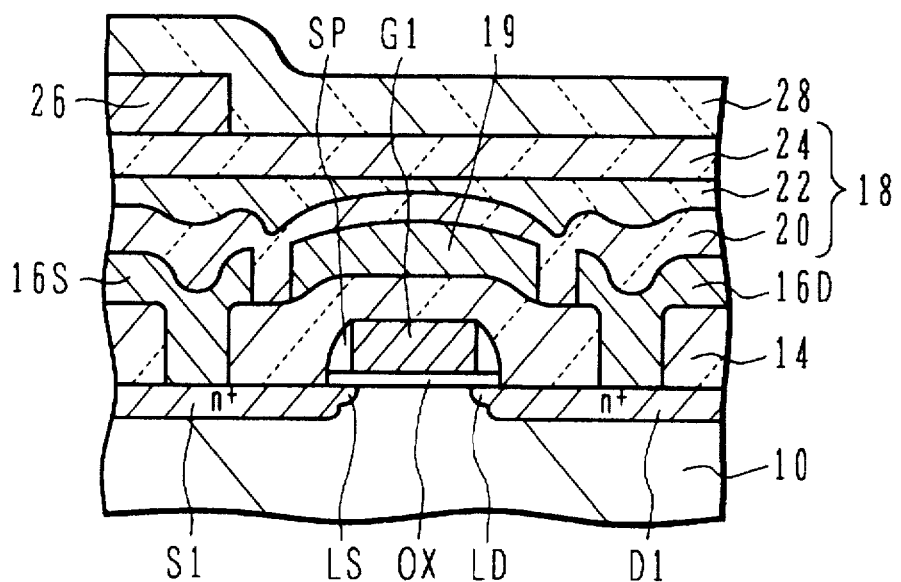

In order to check the validity of the moisture content diffusion preventing structure described above, samples shown in FIGS. 8A and 8B were prepared and comparison tests of degradation of resistance to hot carriers were conducted. In FIGS. 8A and 8B, like elements to those shown in FIG. 1 or 10 are represented by using identical reference numerals and characters, and the detailed description thereof is omitted.

The sample shown in FIG. 8A corresponds to a device according to a conventional technology. In place of the two transistors shown in FIG. 10, only one transistor having the gate G1 was used and the wiring layers 16S and 16D were connected to the source and drain regions S1 and D1, respectively. The sample shown in FIG. 8B corresponds to a device according to the embodiment of the present invention. In place of the two transistors shown in FIG. 1, only one transistor having the gate G1 was used, the wiring layers 16S and 16D were connected to the source and drain regions S1 and D1, respectively, and the wiring layer 19 laid out as shown in FIG. 5 was used as the moisture content diffusion preventing film. Both the samples shown in FIGS. 8A and 8B were manufactured by the method described with reference to FIG. 1.

FIG. 9 is a graph showing the comparison results of degradation of resistance to hot carriers. The abscissa represents a stress applied time in the unit of sec., and the ordinate represents a degradation rate of the drain-source current from the initial value $\Delta I_{ds}$ in the unit of %. For the stress application, the drain-source voltage $V_{ds}$ was set to 7.2 V, and the gate-source voltage $V_{gs}$ was set to 3 V. A line L1 shows the measurement results of the sample shown in FIG. 8A corresponding to the conventional device, and a line L2 shows the measurement results of the sample shown in FIG. 8B corresponding to the embodiment device.

As seen from the measurement results shown in FIG. 9, the time period until the drain-source current $I_{ds}$ is degraded by 10% is $1.5 \times 10^3$ sec for the sample shown in FIG. 8A, and $1.0 \times 10^4$ sec for the sample shown in FIG. 8B. A difference of hot carrier resistance between the two samples is about one digit. It is to be noted that the embodiment of the invention greatly suppresses degradation of hot carrier resistance.

In forming the auxiliary electrodes for a MOS type LSI, if the auxiliary electrode used for moisture content diffusion prevention is provided for all transistors of the LSI, the chip size may become large. In such a case, the auxiliary electrode used for moisture content diffusion prevention may be provided only for the transistors likely to generate hot carriers (having many timings allowing $V_{gs} \cong V_{ds}/2$), such transistors being selected by a circuit simulation or the like. With this measure, an increase of the chip size can be avoided.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A semiconductor device comprising:

(a) a substrate having an active element thereon;

(b) a first interlayer insulating layer formed over the active element;

(c) a conductive wiring layer formed over and contacting the active element, wherein a part of the conductive wiring layer is horizontally extended in a lateral direction to form a laterally extending extra region serving as a conductive moisture blocking film having an overhang portion formed over a blocking region defined within the active element, wherein the overhang portion is smaller than the active element so as to only partially cover the active element; and (d) a second interlayer insulating layer formed over the conductive wiring layer and the active element, wherein the second interlayer insulating layer includes moisture contents therein degrading performances of the active element, and wherein the overhang portion extends the routes for the moisture contents in the second interlayer insulating layer toward the active element so that the blocking film blocks penetration of the moisture contents into the active element.

2. A semiconductor device according claim 1, wherein the second interlayer insulating layer is made of spin-on-glass material.

3. A semiconductor device according to claim 1, further comprising:

(d-1) a third interlayer insulating layer formed on the wiring layer and the blocking layer; and (d-2) a fourth interlayer insulating layer formed on the second interlayer insulating layer.

4. A semiconductor device according to claim 3, wherein the first, third and fourth interlayer insulating layers comprise a material selected from a group consisting of PSG, BPSG and oxide material formed with TEOS and ozone.

5. A semiconductor device according to claim 1, wherein the active element is a field effect transistor.

6. A semiconductor device according to claim 5, wherein the field effect transistor has a gate electrode extending in one direction on a surface of the semiconductor substrate, and the blocking region extends over and overhangs the gate electrode along a direction perpendicular to the one direction on the surface of the semiconductor substrate and further extends over the gate electrode along the one direction.

7. A semiconductor device according to claim 1, wherein conductive the blocking moisture film extends to the wiring layer and is connected thereto.

8. A semiconductor device comprising:

(a) a semiconductor substrate having an active element thereon;

(b) a first interlayer insulating layer formed over the active element;

(c) a wiring layer contacting the active element and having an extra region horizontally extended in a lateral direction to form a laterally extended portion over a blocking region defined within the active element, the laterally extending portion being smaller than the active region and only partially covering the active region; and (d) a second interlayer insulating layer formed over the wiring layer and the active element, wherein the second interlayer insulating layer includes moisture contents therein degrading performances of the active element, and wherein the extended portion extends the routes for the moisture contents in the second interlayer insulating layer toward the active element to thereby block penetration of the moisture contents into the active element.

9. A semiconductor device according claim 8, wherein the second interlayer insulating layer is made of spin-on-glass material.

10. A semiconductor device according to claim 8, further comprising:

(d-1) a third interlayer insulating layer on the wiring layer and the blocking region; and (d-2) a fourth interlayer insulating layer on the second interlayer insulating layer.

11. A semiconductor device according to claim 10, wherein the first, third and fourth interlayer insulating layers comprise a material selected from a group consisting of PSG, BPSG and oxide material formed with TEOS and ozone.

12. A semiconductor device according to claim 8, wherein the active element is a field effect transistor.

13. A semiconductor device according to claim 12, wherein the field effect transistor has a gate electrode extending in one direction on a surface of the semiconductor substrate, and the blocking region extends over and overhangs the gate electrode along a direction perpendicular to the one direction on the surface of the semiconductor substrate and further extends over the gate electrode along the one direction.

14. A semiconductor device comprising:

(a) a semiconductor substrate having an active element thereon;

(b) a first interlayer insulating layer formed over the active element;

(c) a wiring layer contacting the active element;

(d) a dummy layer horizontally spaced from the wiring layer in a lateral direction but being at the same vertical level, the dummy layer being formed over a blocking region defined within the active element, the dummy layer being isolated from the wiring layer and being smaller than the active element so as to only partially cover the active area; and (e) a second interlayer insulating layer over the wiring layer and the active element, wherein the second interlayer insulating layer includes moisture contents therein degrading performances of the active element, and wherein the dummy layer extends the routes for the moisture contents in the second interlayer insulating layer toward the active element to thereby block penetration of the moisture contents into the active element.

15. A semiconductor device according claim 14, wherein the second interlayer insulating layer is made of spin-on-glass material.

16. A semiconductor device according to claim 15, further comprising:

(d-1) a third interlayer insulating layer on the wiring layer and the blocking region; and (d-2) a fourth interlayer insulating layer on the second interlayer insulating layer.

17. A semiconductor device according to claim 14, wherein the first, third and fourth interlayer insulating layers comprise a material selected from a group consisting of PSG, BPSG and oxide material formed with TEOS and ozone.

18. A semiconductor device according to claim 17, wherein the active element is a field effect transistor.

* * * * *